United States Patent [19]
Paoli et al.

[11] Patent Number: 5,832,019
[45] Date of Patent: Nov. 3, 1998

[54] INDEX GUIDED SEMICONDUCTOR LASER BIODE WITH SHALLOW SELECTIVE IILD

[75] Inventors: Thomas L. Paoli, Los Altos; Robert L. Thornton, East Palo Alto; David P. Bour, Cupertino; David W. Treat, San Jose, all of Calif.

[73] Assignee: Xerox Corporation, Stamford, Conn.

[21] Appl. No.: 345,108

[22] Filed: Nov. 28, 1994

[51] Int. Cl.$^6$ ..................................... H01S 3/18
[52] U.S. Cl. ................................. 372/46; 372/50
[58] Field of Search ........................ 372/50, 46

[56] References Cited

U.S. PATENT DOCUMENTS

| | | | |
|---|---|---|---|
| 4,824,798 | 4/1989 | Burnham et al. | 437/81 |
| 4,830,983 | 5/1989 | Thornton | 437/161 |
| 4,980,893 | 12/1990 | Thornton et al. | 372/50 |
| 5,161,167 | 11/1992 | Murakami et al. | 372/46 |
| 5,497,391 | 3/1996 | Paoli | 372/50 |

FOREIGN PATENT DOCUMENTS

| | | | |
|---|---|---|---|
| 0091589 | 10/1983 | European Pat. Off. | 372/50 |
| 59-2380 | 1/1984 | Japan | 372/43 |
| 6-97589 | 4/1994 | Japan | 372/50 |

OTHER PUBLICATIONS

Robert L. Thornton, W.J. Mosby, and H. Chung, "Surface skimming buried heterstructure laser with applications to optoelectronic integration", Applied Physics Letters 59, 513 (1991), 29 Jul. 1991, pp. 513–515.

M.J. Grove, D.A. Hudson, and P.S. Zory, "AlGaAs lasers fabricated with pulsed anodic oxides", paper DLPP3.2 at IEEE/LEOS 6th Annual Meeting, Nov. 1993, San Jose CA p. 24–25.

F.A. Kish, S.J. Carracci, N. Holonyak, Jr., K.C. Hsieh, J.E. Baker, S.A. Maranowski, A.R. Sugg, J.M. Dallesasse, R.M. Fletcher, C.P. Kuo, T.D. Osentowski, and M.G. Craford, "Properties and use of $In_{0.5}(Al_xGa_{1-x})_{0.5}P$ and $Al_xGa_{1-x}As$ native oxides in Heterostructure lasers", Journal of Electronic Materials 21, 1133 (1992). pp. 1133–1139, (no month available).

R.L. Thornton, R.D. Burnham, and T.L. Paoli, "Low threshold buried heterostructure lasers fabricated by impurity–induced disordering", Applied Physics Letters 47(12), 15 Dec. 1985, pp. 1239–1241.

S.O'Brien, D.P. Bour, and J.R. Shealy, "Disordering, intermixing, and thermal stability of GaInP/AlInP superlattices and alloys", Applied Physics Letters 53(19), 7 Nov. 1988, pp. 1859–1861.

(List continued on next page.)

Primary Examiner—Rodney B. Bovernick
Assistant Examiner—Yisun Song
Attorney, Agent, or Firm—Oliff & Berridge, PLC

[57] ABSTRACT

An index-guided semiconductor laser diode made by impurity-induced layer disordering (IILD) of GaInP and AlGaInP heterostructures. In some embodiments, prior to the IILD, wing regions flanking an active mesa region are etched down close to the active layer so that the selective IILD involves a shallow diffusion only. High-performance, index-guided $(AlGa)_{0.5}In_{0.5}P$ lasers may be fabricated with this technique, analogous to those made in the AlGaAs material system. Also described are several techniques for reducing parasitic leakage current via the IILD regions, which include methods for providing p–n junctions or high band gap materials to reduce the parasitic leakage. In other embodiments, a planar structure is produced but with an ultra-thin upper cladding layer. Only a shallow IILD step is necessary to penetrate below the active region. Excessive out coupling and absorption losses are avoided by choosing materials that will minimize such losses, especially a pure gold metal coating as the p-contact metal.

39 Claims, 5 Drawing Sheets

OTHER PUBLICATIONS

R.L. Thornton, D.P. Bour, D. Treat, F.A. P once, J.C./Tramontana and F.J. Endicott, "Defect Generation and Suppression During the Impurity Induced Layer Disordering of Quantum Sized GaAs/GaInP Layers", Material Research Society Symposium Proceedings vol. 280, pp. 445–448, 1993 (No month available).

S.H. Macomber, J.S. Mott, R.J. Noll, G.M. Gallatin, E.J. Gratrix, and S.L. O'Dwyer, "Surface–emitting distributed feedback semiconductor laser", Applied Physics Letter 51(7), 17 Aug. 1987, pp. 472–474.

H.J. Luo and P.S. Zory, "Distributed Feedback Coupling Coefficient in Diode Lasers with Metallized Gratings", IEEE Photonics Technology Letters, vol. 2, No. 9, Sep. 1990, pp. 614–616.

C.H. Wu and P.S. Zory, "Large wavelengh shifts in thin p–clad InGaAs QW lasers", IEEE–LEOS Proceedings, 1994, 2 pages.

INDEX GUIDED SEMICONDUCTOR LASER BIODE WITH SHALLOW SELECTIVE IILD

The U.S. Government has certain rights in the invention as provided by the terms of Advanced Technology Program Award 70NANB2H1241 awarded by the Department of Commerce.

RELATED APPLICATIONS

A commonly-assigned application entitled "Improved Monolithic Array of Independently Addressable Diode Lasers", Ser. No. 08/049,898, filed Apr. 20, 1993, now abandoned in the name of Thomas L. Paoli.

A commonly-assigned application entitled "INDEX GUIDED SEMICONDUCTOR LASER DIODE WITH REDUCED SHUNT LEAKAGE CURRENTS", Ser. No. 08/367,549, filed Jan. 3, 1995 now abandoned in the names of Kevin J. Beernink, David P. Bour, Thomas L. Paoli, Ross D. Bringans, and Gregory J. Kovacs. (XRX-158)

A commonly-assigned application entitled "Thermally Processed, Phosphorus- Or Arsenic-Containing Semiconductor Laser with Selective IILD", in the names of Robert L. Thornton and David P. Bour, Ser. No. 08/368,676, filed Jan 4, 1995. (XRX-153)

BACKGROUND OF THE INVENTION

Selectively-buried ridge (SBR) waveguide structure to achieve index guided lasers fabricated by selective etching regrowth of III–V material are known. Compared to the SBR lasers, impurity-induced layer disordering (IILD) can be used to realize lasers with narrower width (for lower threshold and a more circular beam), lower distributed loss (for higher efficiency), and stronger lateral index guiding (for less astigmatism).

The basic IILD process relies on the in-diffusion of an impurity (silicon, germanium, zinc, etc.) which promotes intermixing of atoms on the group-III sublattice [1]. Bracketed numbers refer to patents/publications listed in the Appendix. The layers comprising a heterostructure can thus be intermixed into a homogenous alloy whose composition is an average of the original layers. For example, a superlattice of 100 Å $Ga_{0.5}In_{0.5}P$/100 Å $Al_{0.5}In_{0.5}P$ will be intermixed to an alloy of $(Al_{0.5}Ga_{0.5})_{0.5}In_{0.5}P$. When a laser active layer is intermixed with adjacent cladding layers in this manner, the refractive index of the mixture is lower than that of the original active layer. Consequently, a lateral waveguide can be formed by IILD. Similarly, the intermixed layers also have higher band gap energy, resulting in the lateral confinement of injected carriers in a laser stripe. These attributes of IILD make it a desirable technique for the fabrication of high performance index-guided laser diodes.

A standard index-guided AlGaAs laser diode 10 fabricated by impurity-induced-layer-disordering (IILD) is shown in FIG. 1. Selective silicon diffusion from a solid, arsenic-doped silicon film induces intermixing of the quantum well (QW) heterostructure active layer 11 with the carrier confinement layers 11a, 11b, the p-clad 17 and the n-clad 18. The intermixed regions 12, 13 consequently have a higher band gap energy and lower refractive index than the as-grown quantum well. However, the resultant high silicon doping ([Si] ~$10^{19}$ cm$^{-3}$) also yields a high electron concentration in the intermixed regions 12, 13. Therefore, to prevent current from shunting through the intermixed regions when voltage is applied across the top 20 and bottom 21 contacts, and around the active (unintermixed) stripe 19, a shallow zinc diffusion 15 is used to create a p–n junction 16 in the high-band gap, intermixed regions 12 and 13. Thus, current is only injected into the unintermixed stripe region 19, and the surrounding intermixed regions 12, 13 provide very strong lateral confinement of both the optical mode and the injected carriers. In this way, the confinement offered by the IILD buried heterostructure can be superior to that offered by other laser diode structures (ridge waveguide, channelled-substrate-planar, etc.).

Although the IILD process has been perfected for the AlGaAs materials system, its application to the AlGaInP materials system is not straightforward. Among the most important differences between AlGaAs IILD and AlGaInP IILD is the slower diffusion rate of silicon in AlGaInP.

In addition, p-doping is more difficult in AlGaInP. Indeed, it has so far proven impossible to p-dope $Al_{0.5}In_{0.5}P$ at a level of p=1×1018 cm$^{-3}$ with zinc diffusion. In comparison, the silicon n-doping resulting from IILD is considerably higher than the maximum p-doping available from zinc. Therefore, the zinc diffusion used after IILD of AlGaAs heterostructures, required to block shunt-current paths, is not very 15 effective in AlGaInP.

From another aspect, multiple laser sources are beneficially needed in certain laser printers. Compatibility with current and future photoreceptors requires that these multiple laser sources be fabricated in layers of AlInP, GaInP, or their combinations. Following previous work in AlGaAs materials, we believe that impurity-induced layer disordering is a preferred way to define closely spaced lasers. However, the straightforward extension of the AlGaAs layer disordering technology to the AlGaInP material system has encountered several problems which thus far have prevented development of a workable process for forming a buried heterostructure laser.

BRIEF SUMMARY OF INVENTION

An object of the invention is an improved index-guided III–V semiconductor laser.

A further object of the invention is an improved index-guided laser fabricated in AlInP or GaInP or AlInGaP.

Another object of the invention is an index-guided semiconductor laser fabricated by IILD and exhibiting reduced leakage current.

Still a further object of the invention is an index-guided semiconductor laser fabricated by IILD and which will not need a type conversion to reduce shunt leakage current.

In accordance with one aspect of the present invention, an index-guided laser diode is fabricated by IILD applied in a more shallow manner than is typical of traditional IILD structures. This offers the important advantage of greatly reducing the processing time, especially for the fabrication of AlGaInP diodes, wherein it was discovered that the traditional process such as used in the AlGaAs system was much too slow due to the slower diffusion rates of the active species.

In addition, it is found that structures produced by the novel method of the invention have smaller parasitic current injection.

In accordance with a further aspect of the invention, the active layer in the diode striped region whence the emission results is located relatively deeply in the semiconductor structure and sufficiently remote from the upper contact and metal layers to reduce out-coupling and absorption losses. In this case, semiconductor material flanking the stripe region down to the vicinity of the active layer must be removed prior to IILD disordering to ensure that only a shallow disordering is needed to penetrate below the active layer.

In accordance with a feature of this aspect of the invention, considerable material of the as-grown epitaxial layers is physically removed on opposite sides of the active stripe or ridge region to produce a mesa-type structure. This further acts to reduce potential leakage paths that would undesirably shunt the active region.

In accordance with still a further feature of this aspect of the invention, IILD is used to fabricate a multiple buried heterostructure index guided laser array in a shallow mesa structure technique. In a preferred embodiment, the source of the layer disordering is placed close to the active layer by etching the as-grown semiconductor layers to form recessed areas where the IILD is to be carried out. This approach incorporates into the fabrication of a visible laser diode many of the same advantages enumerated above of reduced processing time and reduced leakage current, plus other advantages to be enumerated below.

In accordance with still another aspect of the invention, no significant material removal is necessary before IILD disordering, and yet a shallow disordering step is possible by our discovery that certain contact materials, even though located relatively close to the active layer, contrary to our previous experience, will not significantly increase the out-coupling or absorption losses of the desired radiation. An important advantage of this configuration is that a substantially planar structure results which offers certain processing advantages compared with a mesa-type structure that typically results from selective removal of material.

The several aspects of the invention stated above are preferably achieved by a disordering step carried out from a surface of the structure not more than about 500 nm from the active layer.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

DETAILED DESCRIPTION OF PREFERRED EMBODIMENTS

Figure 1:
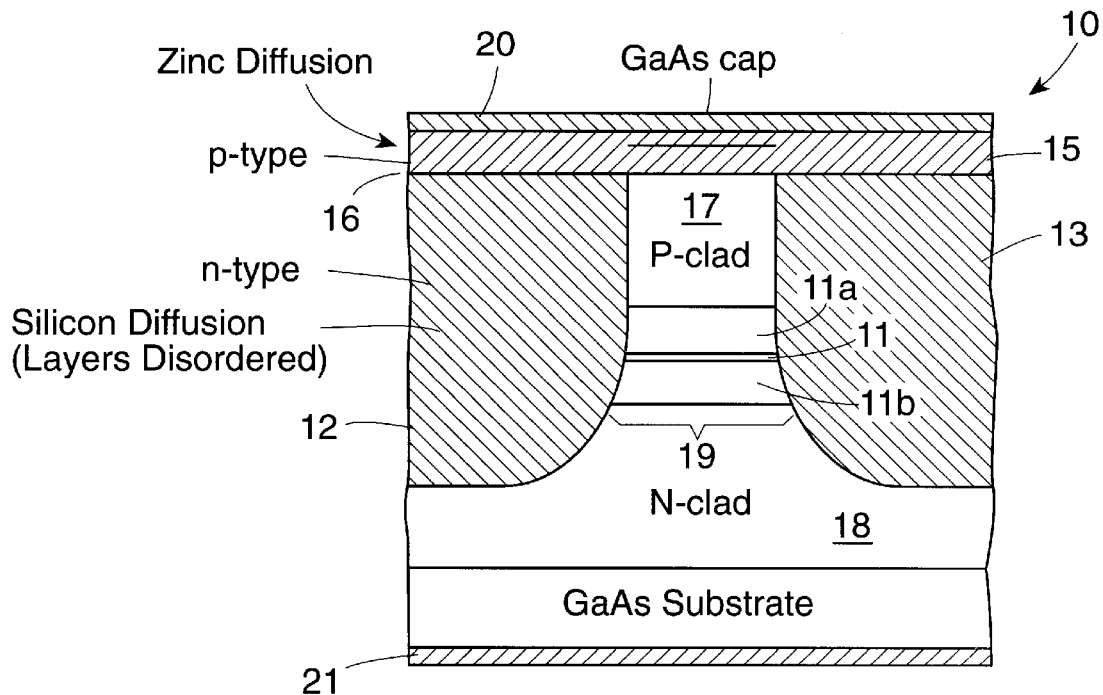
FIG. 1 is a cross-section of a typical index-guided AlGaAs laser diode fabricated by IILD.

In the preferred embodiments according to this invention, we describe structures which address the problematic features of the AlGaInP materials system as described above, thus enabling IILD to be used to fabricate AlGaInP buried heterostructure laser diodes. Our first embodiment mesa-type laser 50 is shown in FIG. 2. In essence, it is a buried heterostructure laser formed by IILD, wherein the IILD is generated from a diffusion source located outside of a striped mesa region 70, closer to the active layer than in the AlGaAs laser of FIG. 1.

This laser structure can be realized by the following process, whose beginning is much like forming a ridge waveguide laser. The laser 50 includes: a substrate 60 of n-GaAs upon which is epitaxially deposited by conventional techniques, such as MBE or MOCVD, a lower cladding layer 61 of n-$Al_{0.5}In_{0.5}P$, an active waveguide multilayer 62 (preferably undoped), a first upper cladding layer 63 of p-$Al_{0.5}In_{0.5}P$, an etchstop layer 64 of p-$Ga_{0.5}In_{0.5}P$, a second upper cladding layer 65 of p-$Al_{0.5}In_{0.5}P$, a transition layer 66 of p-$Ga_{0.5}In_{0.5}P$, and a contact layer 67 of p-GaAs. The active waveguide multilayer 62 may, for example, be comprised of a single quantum well layer of $Ga_{0.5}In_{0.5}P$ sandwiched between upper and lower carrier confinement layers of $(Al_{0.6}Ga_{0.4})_{0.5}In_{0.5}P$. other configurations of the active waveguide multilayer 62 containing multiple quantum wells and barrier layers or other carrier confinement layers are also possible. The contact layer 67 may also be p-$Ga_{0.5}In_{0.5}P$ if desirable.

The etch stop layer 64 of p-$Ga_{0.5}In_{0.5}P$ is typically between 0.1 to 0.4 $\mu$m from the active layer 62. The p-GaAs contact layer 67 is doped to a carrier concentration greater than $10^{19}/cm^3$.

After production of the above layered structure, the lateral structure of laser 50 is formed according to the following preferred method. A mask, patterned with narrow stripes, is formed on the top surface of the as-grown wafer. Shallow mesas 70 are formed by etching the as-grown wafer outside of the masked stripes down to the surface 72. If a wet chemical etch is used, the mesa sidewalls 73 are sloped along crystallographic planes as shown in FIG. 2. The thin etch stop layer 64 enables accurate and reproducible control of the depth of the etched mesa as known in the art. Alternatively, reactive ion etching can be used to define the mesa with vertical sidewalls and thereby avoid the widening at the base of the mesa.

After the mesas 70 are formed, the wafer is prepared for layer disordering. In a preferred approach, the etching mask is removed and the entire surface is coated with $Si_3N_4$:P. It should be noted that this procedure provides a nitride capping layer over the top and sides of the mesas. Alternatively the second coating with $Si_3N_4$:P can be applied without removal of the etching mask. The nitride film is then photolithographically patterned to open windows on both sides of each mesa where the nitride is removed. A silicon film doped with phosphorus is deposited over the windows onto the exposed surface and over the mesas (covered with $Si_3N_4$:P). The entire surface is capped with a blanket layer of $Si_3N_4$:P. Annealing is performed as taught by Thornton in U.S. Pat. No. 4,824,798 or U.S. Pat. No. 4,830,983 to in-diffuse the silicon. During the diffusion the heterostructure layers are intermixed to form alloyed wing regions 71. As a result of the intermixing process, the etch-stop layer 64, the first upper cladding layer 63, the waveguide multilayer 62, and a portion of the lower cladding 61 are mixed to form alloyed regions 71 with a band gap energy greater and a refractive index lower than that of the active layer. After the layer disordering is completed, the $Si_3N_4$:P and Si:P layers are removed and an electrically insulating layer 75, e.g. of polyimide or $Si_3N_4$, is applied to the surface. Windows are opened in the insulating layer above each mesa to allow contacting of the p-contact layer with a metal contact 76. Contacting is completed by applying an ohmic-contact metal 77 to the substrate. Separate laser devices are formed from the wafer by conventional techniques well-known in the art.

An alternate approach to forming the laser structure 50 is to use the vacancy-enhanced layer disordering process as disclosed by O'Brien [4]. In this case only $SiO_2$ is deposited on the wafer after the windows are opened in the nitride on both sides of each mesa. During the annealing process Ga vacancies migrate through the $SiO_2$ into the epitaxial layers and produce layer disordering without impurities. This process has the advantage that the insulating layer 75 is not needed to block leakage currents because the alloyed regions 71 have a much lower carrier concentration than required for effective carrier injection from the metallic contact 76.

Several important features of this structure should be noted. Firstly, deposition of the Si:P or the SiO2 layer on the etch stop layer places the impurity source required in the impurity-induced layer disordering or the vacancy source required in the vacancy enhanced layer disordering as close as 100 nm to the active waveguide layer 62. Thus silicon or vacancies will need to diffuse only a short distance to form the lasing waveguide, thus greatly reducing the diffusion time required to less than 10 hours. This time compares favorably with the corresponding diffusion times required to form the AlGaAs laser depicted in FIG. 1. Secondly, parasitic p–n junctions are not formed in the p-contact layer 67 since the silicon diffusion, taking place below the cap layer 67, does not penetrate the cap layer 67. Thus type conversion of an impurity diffused region in low band gap material is not required. Thirdly, the as-grown layer of degenerately p-doped GaAs 67 remains in the mesa to provide electrical contacting after the layer disordering has been completed. This is advantageous because low resistance contacting of GaAs, which is well known in the art, can be achieved on the as-grown structure without additional processing. Fourthly, the interface between the alloyed regions 71 and the as-grown layers can be allowed to diffuse around the base of and up into the mesa as shown at 71' in FIG. 2, provided the impurity diffusion front does not reach the p-GaInP layer 66. This position of the interface is useful because it narrows the width of the active layer 62 defined by the alloyed regions 71 to less than the width of the mesa base and can be controlled by the difference between the width of the diffusion mask and the mesa base. As is well known in the art, the width of the active region needs to be sufficiently narrow to produce a buried optical waveguide that preferentially propagates the fundamental optical mode. Alternatively, the interface can be kept out of the mesa, provided the mesa base is sufficiently narrow.

A disadvantage encountered in forming laser 50 with impurity-induced layer disordering is that a parasitic p–n junction is formed at the interface of the etch stop layer 64 with the alloyed regions 71. However, leakage through this junction can be made quite small since the thickness of the etch stop layer can be less than 10 nm. Alternatively, this leakage path can be completely eliminated by forming the alloyed regions with the impurity-free process of vacancy-enhanced layer disordering.

Figure 3:
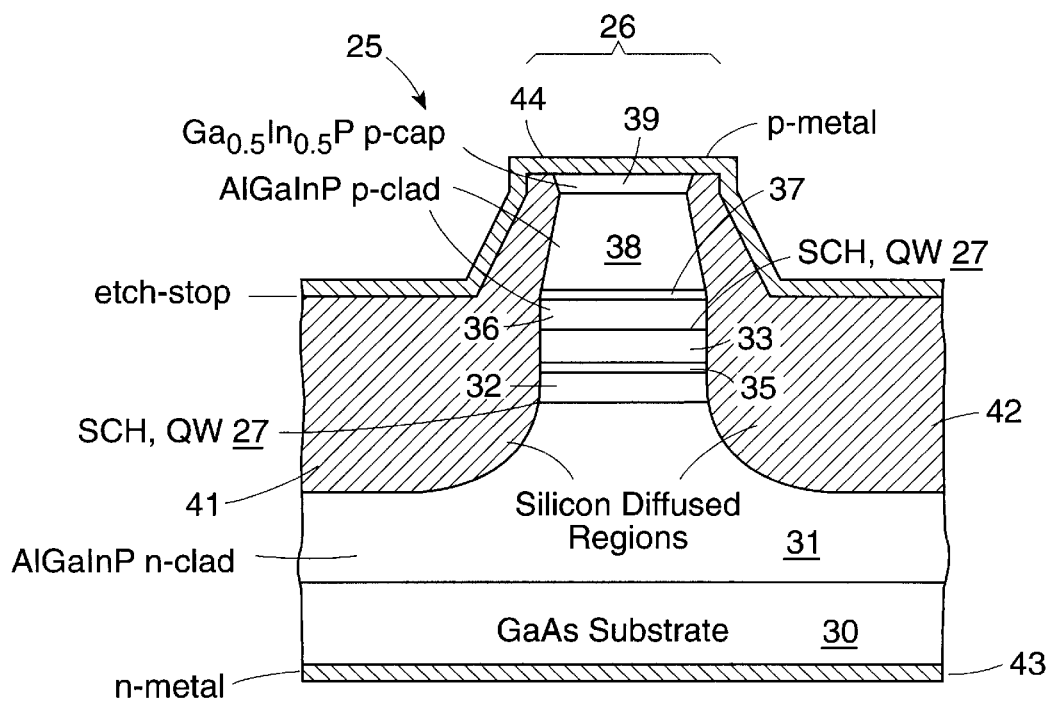
FIG. 3 is a schematic cross-section of a second form of a mesa-type index-guided diode laser fabricated by IILD in accordance with the invention.

A second preferred embodiment of this invention addressing features of the AlGaInP materials system that are problematic for fabricating buried heterostructure lasers is shown in FIG. 3. The laser 25 includes: a substrate 30 of n-GaAs upon which is epitaxially deposited a lower cladding layer 31 of n-$Al_{0.5}In_{0.5}P$, a conventional sandwich of n-type lower 32 and p-type upper 33 confinement layers and an intermediate active layer 35, typically of GaInP, a first upper cladding layer 36 of p-$Al_{0.5}In_{0.5}P$, (or alternatively p-AlGaInP, as shown in FIG. 3, where lower cladding layer 31 is n-AlGaInP ) an etch stop layer 37 of p-$Ga_{0.5}In_{0.5}P$ (discussed further below), a second upper cladding layer 38 of p-$Al_{0.5}In_{0.5}P$, (or alternatively Op-AlGaInP, as shown in FIG. 3, where lower cladding layer 31 is n-AlGaInP) and a cap layer 39 of p-$Ga_{0.5}In_{0.5}P$. Except for the etch stop layer 37 and the cap layer 39, the compositions and thicknesses of the other layers are conventional. The layer structure of laser 25 is similar to the layer structure of the first embodiment laser 50 with the exception of the cap layers. A $Ga_{0.5}In_{0.5}P$ cap layer is preferred in the layer structure of laser 25 because it will be partially disordered in the IILD to be described below.

Following the production of the foregoing structure, a preferred method according to the invention comprises the following steps:

1. deposition of $Si_3N_4$: P (not shown), and lithographic patterning of the nitride film into narrow stripes to form a mask.
2. Etching of a mesa stripe 26, using the $Si_3N_4$:P as an etch mask.
3. Deposition of Si:P/$Si_3N_4$:P films over the mesa (the mesa top is still covered with $Si_3N_4$:P).
4. Annealing to in-diffuse the silicon and selectively (outside the mesa) intermix the heterostructure to form disordered wing regions 41, 42.
5. Stripping the $Si_3N_4$:P and Si:P films, depositing ohmic-contract metals at bottom 43 and at top 44, and cleaving into lasers.

This process differs from the process used to fabricate the first embodiment laser 50 in FIG. 2 in that the sides of the mesa 26 are coated with Si:P and then $Si_3N_4$:P for the fabrication of laser 25 whereas the sides of the mesa are coated with only $Si_3N_4$: P in the fabrication of laser 50.

It will be appreciated from the foregoing description that the etch-stop 37 serves to stop the etching process along the flanks of the mesa 26 when the etchant reaches the etch-stop. For this purpose, the etch-stop layer can be made of, for example, GaInP and the etchant for the AlGaInP can, for example, be dilute HCl (3 parts $H_2O$, 1 part HCl). Preferably the diffusion source for IILD, formed over the etch-stop 37, is no more than 400 nm from the upper surface of the upper confinement layer 33. Where the spacing of the diffusion source is, for example, between 100 and 500 nm from the active layer 35, a typical diffusion time is less than 10 hours. This compares favorably with the corresponding Si diffusion time for the AlGaAs laser depicted in FIG. 1.

Figure 4A:
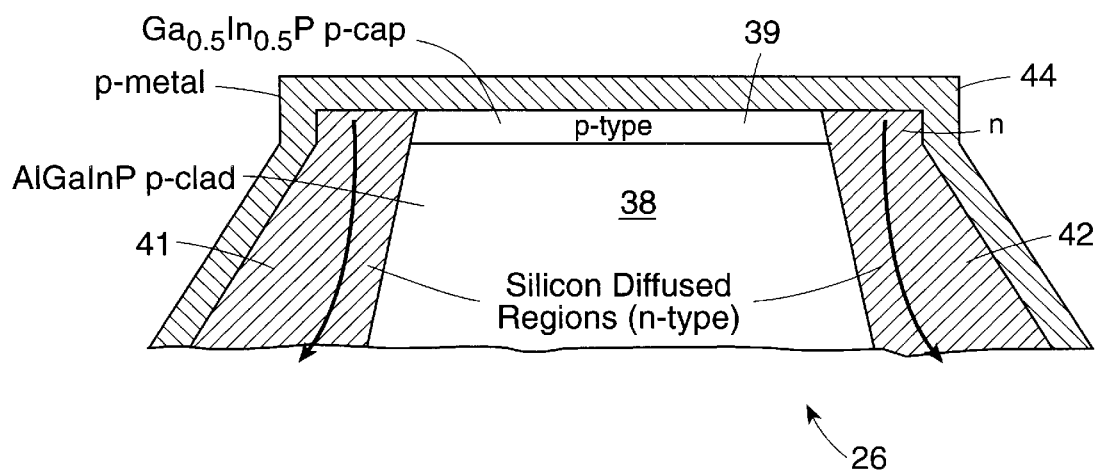
FIG. 4A and 4B are partial cross-sections further illustrating an improved form of the mesa-type index-guided laser shown in FIG. 3 and fabricated in accordance with the invention.
Figure 4B:
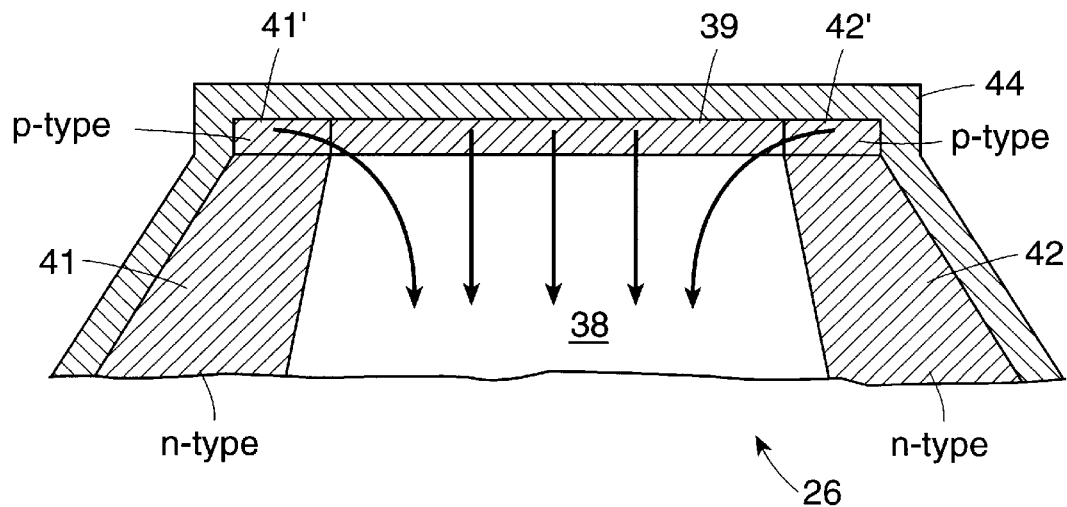

One possible complication with the simple structure described in connection with FIG. 3 is still the possibility of a shunt-current path created by the top (mesa) metallization contacting the Si-diffused (highly n-type) regions 41, 42 on the sides of the mesa top. This is shown in a magnified view of the mesa top in FIG. 4A. The shunt path shown by the arrows is along the top, outside n-type regions of the mesa sidewall. If, however, the surface can be converted back to p-type, this shunt path can be eliminated, as shown in FIG. 4B at 41', 42'. In this case, a shallow zinc or beryllium diffusion can be used to convert the $Ga_{0.5}In_{0.5}P$ cap 39 to p-type from the n-type conductivity resulting from silicon diffusion prior to p-contact metallization. The p-type impurity diffusion could be accomplished by, for example:

1. Diffusion from a gas source, for example, zinc diffusion in an open-tube furnace or a closed ampoule,
2. Diffusion from a solid film, for example, a ZnO diffusion source, or 3. An alloyed p-contact metal, for example a Be-Au alloy or a Zn-Au alloy metal, which upon thermal annealing yields a high surface concentration of beryllium or zinc, respectively.

Figure 2:
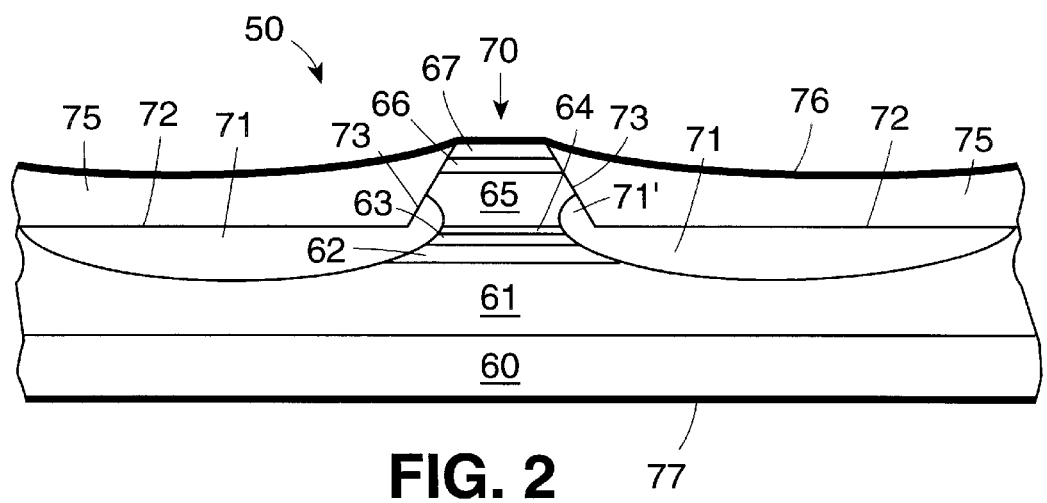
FIG. 2 is a schematic section of a first form of a mesa-type index-guided diode laser fabricated by IILD in accordance with the invention.

This p-conversion diffusion 41', 42' is much simpler and less time consuming than the comparable p-conversion in the FIG. 1 structure, since the volume of material to be converted is much smaller, and the p-diffusion can take place both from the side as well as the top as a result of the mesa geometry.

A parasitic p–n junction does however remain at the interface of the etch stop layer 37 with the alloyed regions 41 and 42. Leakage through this junction can be made quite small as described earlier since the thickness of the etch stop layer can be less than 10 nm. Alternatively this leakage path can be completely eliminated by forming the alloyed regions with the impurity free process of vacancy-enhanced layer disordering.

An additional possible complication is isolating the contact 44 to the top of the mesa 26. In the device shown in FIG. 3, this is accomplished in part through the high Schottky barrier characteristic of the intermixed material (since it is of higher band gap than GaInP). In addition, the intermixed materials contain aluminum, which is naturally oxidized. Therefore, the least resistive current path is likely to be through the top of the mesa, where the metal contacts GaInP 39.

Figure 5A:
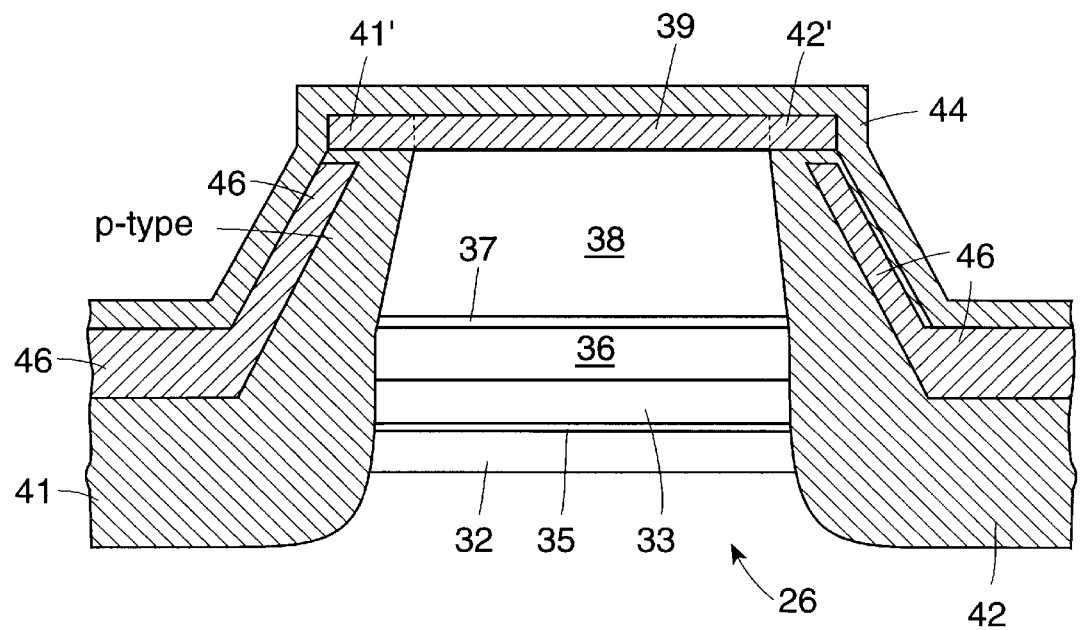
FIG. 5A and 5B are schematic cross-sections of further improved forms of the mesa-type index-guided laser shown in FIG. 4B and fabricated in accordance with the invention.
Figure 5B:
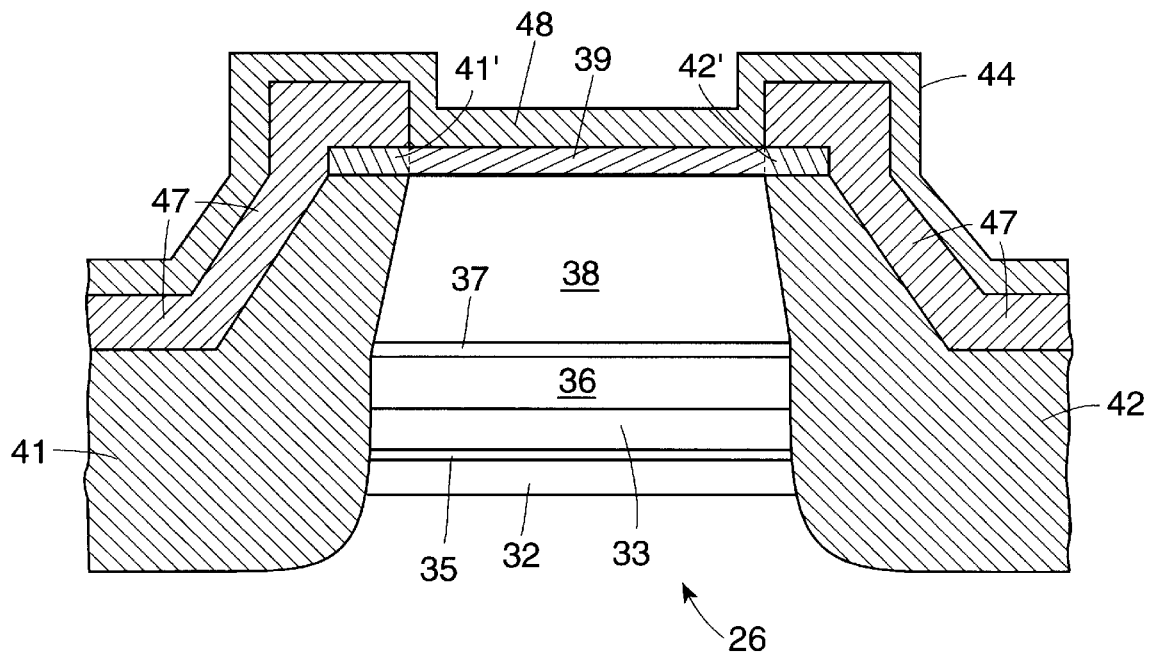

On the other hand, the intermixed surface 41, 41', 42, 42' is also heavily n-doped, which tends to create a less resistive contact. If the high Schottky barrier, plus oxidation, of the intermixed material is insufficient for restricting current injection to the mesa, an additional process step in accordance with the invention can be included to fix the injection path. Among the options for better restricting the injection to the mesa 26 are:

1. A shallow proton implant 46, to make the material 46 outside the mesa insulating, thus blocking current (FIG. 5A), or
2. An oxidation to make a thick (~1000 Å) surface oxide 46 outside the mesa. Either an anodic oxidation [2], or a hot-water-vapor oxidation [3] could be masked with the $Si_3N_4$:P on top of the ridge used for the etching step as described above (FIG. 5A), or
3. A dielectric 47 deposited over the wafer, and a window 48 opened at the top of the mesa before metallization with the contact layer 44. The dielectric 47 could be, for example, $SiO_2$ or $Si_3N_4$; and for planarity, potting in polyimide as was done in FIG. 2 would work well.

Summarizing, the advantages of the index-guided laser structures so far described over a more traditional IILD laser is that only a shallow IILD is required since the structure is ridged, and the source of intermixing is performed outside the pre-formed mesa. Also, since the source for the layer disordering can be placed as close to the active layer as desired, preferably not more than 500 nm, and independent of the contacting, it introduces another degree of freedom into controlling the position of the lateral diffusion front. Proximity of the source layer to the active layer also decreases the required diffusion time and permits reproducible use of impurity-free processes. Since the source layer is placed on a wide-band gap layer, the AlGaInP, type conversion of only the cap layer edges is needed to block current through parasitic p-n junctions formed by the n-type diffusion. Elimination of conversion of AlGaInP is important in the fabrication of visible diode lasers since high levels of active p-type dopants are difficult to achieve in AlInP or AlGaInP.

Figure 6:
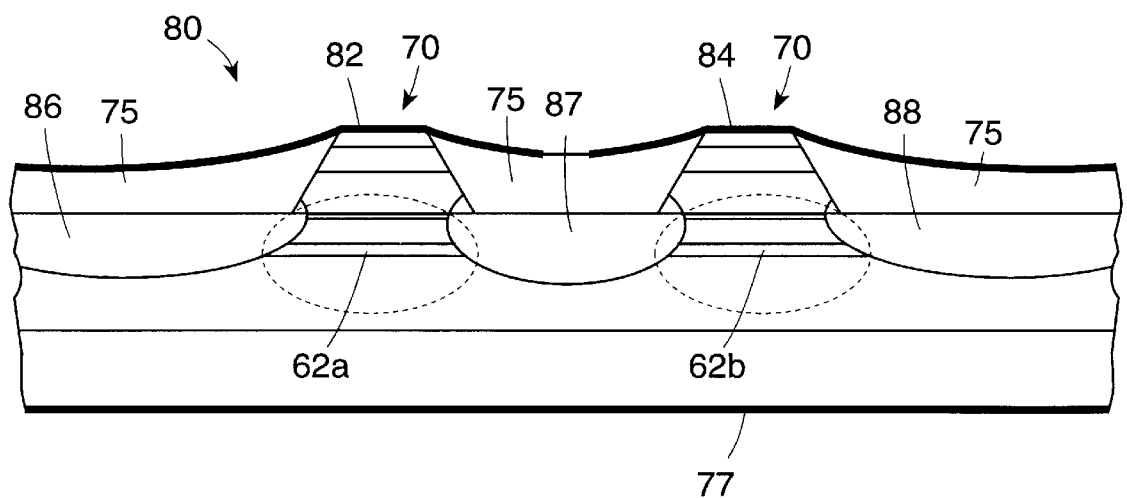
FIG. 6 is a schematic cross-section of a dual laser array fabricated by IILD in accordance with the invention.

The methods of forming lasers 50 and 25 according to this invention are especially useful for producing monolithic arrays of closely spaced, independently addressable diode lasers with low thermal, electrical and optical crosstalk. FIG. 6 illustrates an example of such a laser array 80 comprised of two side-by-side lasers each of which is formed according to this invention. The lasing modes of the two side-by-side layers are indicated by the dotted ellipsoids centered about each of the active layers 62a and 62b. The two lasers share a common contact 77 on the substrate but have separate p-contacts 82 and 84 enabling each laser to be individually addressed. The intermixed regions 86, 87 and 88 define between them the individual lasers. Furthermore region 87 provides electrical and optical isolation between adjacent lasers.

In the previous embodiments of FIGS. 2–6, the active layer is located a considerable distance from the p-type cap layer (39 in FIG. 3) and the p-metal contact (44 in FIG. 3), achieved by making the upper p-cladding layer (38 in FIG. 3) at least 1 μm thick. The reason for this is that the evanescent tail of the optical mode overlaps the capping layers, leading to outcoupling losses (the GaInP+GaAs capping layers have relatively high index) and absorption losses (the GaAs cap and normal contact metals are particularly strong absorbers of red light). These increased losses result in higher thresholds, lower efficiency and possibly no lasing action. In typical laser diodes, by making the upper cladding layer sufficiently thick (~1 μm) these losses are reduced to <1 $cm^{-1}$. Indeed, when the cladding layer thickness starts to exceed about ~0.8 μm, it can be treated as semi-infinite. With the resultant thick upper cladding layer, the mesa-type structures above described are needed to provide the impurity source for IILD sufficiently close to the active layer, specifically within 500 nm and preferably not more than about 100 nm (=1000 Å) from the active layer.

We have discovered that it is possible to construct a planar structure with an upper cladding layer of the order of 2000 Å thick (about 100–300 nm) provided that (1) the capping layers are made thin, no greater than 100 nm, thereby reducing the outcoupling and absorption loss, and (2) the contact metal is substantially pure gold, with less than 10% impurities, which is in contrast to the typical chromium/gold or titanium/gold multi-layer coatings in which the Cr or Ti is vapor-deposited before the Au. While it turns out that gold is lossy, like other metals, since the imaginary part of its refractive index is appreciable, in contrast to other metals, the real part of its refractive index is small, and not well-matched to that of the semiconductor. Consequently, the optical mode does not penetrate into the gold, and so the gold does not introduce additional loss [8–10]. While this principle has been applied to distributed Bragg reflector lasers, in which case a gold-coated grating does not introduce loss, and because it also increases the grating reflectivity [9–10], to our knowledge, no one before us had suggested combining an ultra-thin upper cladding layer with a gold contact layer in an IILD index-guided semiconductor laser diode to reduce outcoupling and absorption losses in a shallow structure in which the index-guiding regions are formed by a shallow disordering process.

Figure 7:
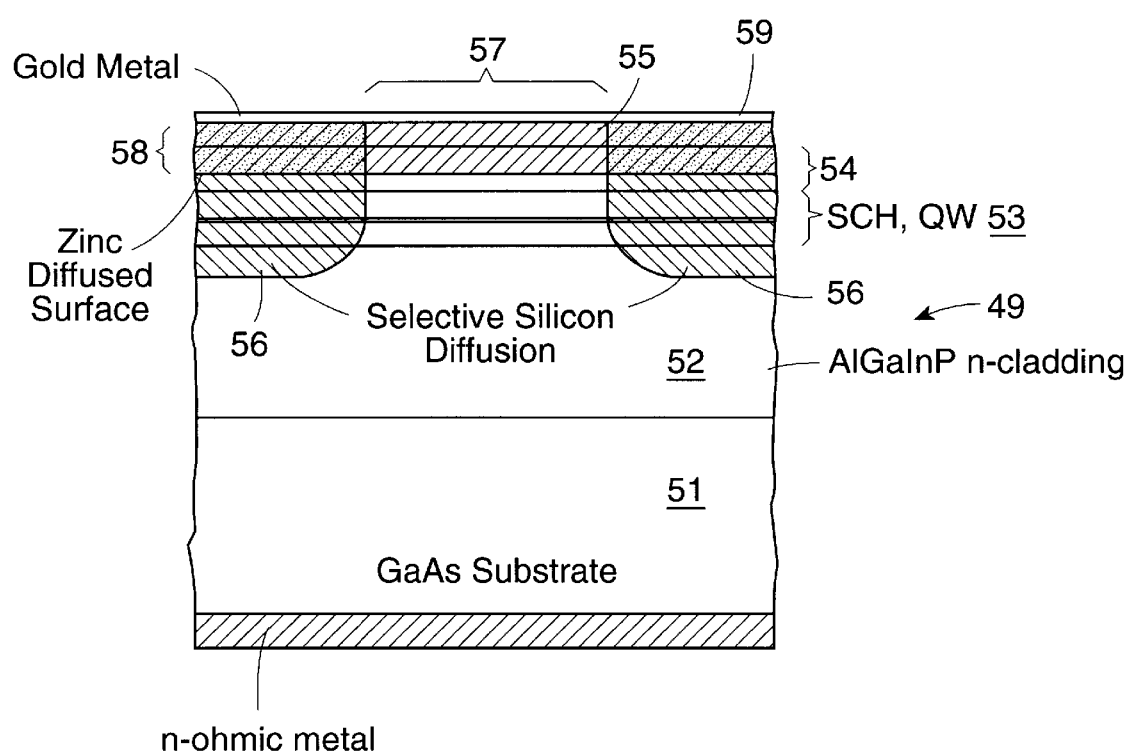
FIG. 7 is a schematic cross-section of one form of planar index-guided laser diode fabricated in accordance with the invention.

FIG. 7 illustrates one form of planar structure 49 in accordance with the invention. It comprises the usual GaAs substrate 51 on which are epitaxially deposited a lower cladding layer 52 of AlGaInP, the QW heterostructure active layers 53 with carrier confinement layers of AlGaInP, an ultra-thin upper cladding layer 54 of AlGaInP, and thin GaInP p+ cap layer 55. Following growth of the structure, the surface is masked as described in connection with the previous examples, and Si diffused in to form disordered regions 56 flanking a center stripe region 57. Subsequently, a blanket zinc diffusion 58 is carried out to suppress shunting currents. Finally, a metal contact 59 is made to the stripe region 57 by depositing a substantially pure gold metal layer over the surface of the zinc diffused region 58. The resultant crystal is cleaved to provide the usual end mirrors. Because the upper cladding layer 54 is so thin (less than about 300 nm), and with the usual thin cap layer of about 50 nm, only a shallow IILD is required to reach below the active layer 53. The spacing from the bottom of the active layer to the top of the semiconductor structure is preferably no more than about 400 nm, so that the time required for the IILD diffusion in the AlGaInP is about the same as that required for the much thicker AlGaAs structure. Satisfactory laser operation is obtained despite the closeness of the cap and metal contact layers to the active layer by the combination of the thinner upper cladding layer and the pure gold metal contact.

The structure illustrated differs from normal red lasers not only due to the thinner cladding layer (2000 Å instead of 10,000–12,000 Å) but also provides improved performance due to a thin p+ contacting layer 55 of GaInP (500 Å, instead of the more usual 2-layer combination of GaInP and GaAs; GaInP is transparent for λ) 650 nm, but its high index may still contribute an outcoupling loss). The GaAs layer is eliminated for two reasons: 1) it would cause additional absorption and outcoupling losses, and 2) if it were to be intermixed into the underlying AlGaInP during IILD, severe lattice mismatch would result, with ensuing dislocations. On the other hand, a very thin layer of GaAs could be included to facilitate ohmic contacting (the additional loss introduced by a film up to about 300 Å thick are acceptable, but only about 50–80 Å may be intermixed into the underlying phosphide layers without generating dislocations [11].

This wafer was processed into broad-area lasers by evaporating 100 μm gold stripes onto the GaInP p+ cap. Subsequently, the substrate metal was applied, laser bars were cleaved, and the devices were tested pulsed at room temperature. Performance characteristics of a 750 μm long by 100 μm wide stripe were:

threshold current density=500 A/cm$^2$ differential quantum efficiency=15%/facet wavelength=678 nm In summary, the advantages of the thin-p-clad planar structure of FIG. 7 are:

1. Incorporating a thin GaInP cap and pure gold contact metal leads to acceptably low modal loss, so that good performance characteristics are obtained. A GaAs cap may also be included for lower series resistance, but it must be made thin to avoid additional loss and dislocations during IILD.
2. The thin-p-clad structure requires only a shallow IILD for forming index-guided lasers. This is important because the impurity diffusion rates are much lower in AlGaInP than in AlGaAs, making it difficult to form IILD-lasers from conventional structures with about 1 μm upper cladding layers.
3. A thin upper cladding layer also improves the heat-dissipation of the laser diode.
4. Does not require regrowth like other shallow, planar IILD structures [1].

It will also be appreciated that the structure of FIG. 7 can be replicated in adjacent portions of the semiconductor body to form an array similar to that of FIG. 6.

The referenced related applications and the referenced patents/publications are hereby incorporated by reference.

While the invention has been described in conjunction with specific embodiments, it will be evident to those skilled in the art that many alternatives, modifications, and variations will be apparent in light of the foregoing descriptions. Accordingly, the invention is intended to embrace all such alternatives, modifications, and variations as fall within the spirit and scope of the appended claims.

APPENDIX

REFERENCES

[1] R. L. Thornton, W. J. Mosby, and H. F. Chung, "Surface skimming buried heterostructure laser with applications to optoelecronic integration", *Applied Physics Letters* 59, 513 (1991).

[2] M. J. Grove, D. A. Hudson, and P. S. Zory, "AlGaAs lasers fabricated with pulsed anodic oxides", paper DLPP3.2 at *IEEE/LEOS 6th Annual Meeting*, November 1993, San Jose, Calif.

[3] F. A. Kish, S. J. Carracci, N. Holonyak, Jr., K. C. Hsieh, J. E. Baker, S. A. Maranowski, A. R. Sugg, J. M. Dallesasse, R. M. Fletcher, C. P. Kuo, T. D. Osentowski, and M. G. Craford, "Properties and use of $In_{0.5}(Al_xGa_{1-x})_{0.5}P$ and $Al_xGa_{1-x}As$ native oxides in heterostructure lasers", *Journal of Electronic Materials* 21, 1133 (1992).

[4] O'Brien, Appl. Phys. Lett, 53, 1859 (1988).

[5] U.S. Pat. No. 4,824,798.

[6] U.S. Pat. No. 4,830,983.

[7] R. L. Thornton et al. "Low Threshold Planar Buried Heterostructure Lasers Fabricated by Impurity-Induced Disordering", Appl. Phys. Lett., 47, 1239 (1985).

[8] "Large wavelength shifts in thin p-clad InGaAs QW lasers", C. H. Wu, P. S. Zory, and M. A. Emanuel, IEEE LEOS 1994 Proceedings.

[9] "Distributed Feedback Coupling Coefficient in Diode Lasers with Metallized Gratings", H. J. Luo and P. S. Zory, IEEE Photonics Technology Letters 2, 614 (1990).

[10] "Surface-emitting distributed feedback semiconductor laser", S. H. Macomber, J. S. Mott, R. J. Noll, G. M. Gallatin, E. J. Gratrix, S. L. O'Dwyer, and S. A. Lamber, Applied Physics Letters 51, 472 (1987).

[11] "Defect generation and suppression during the impurity induced layer disordering of quantum sized GaAs/GaInP layers", R. L. Thornton et al., MRS Proceedings 280, 445 (1993).

What is claimed is:

1. A method of making a buried heterostructure semiconductor diode laser, comprising the steps:

(a) providing a structure having at least III–V crystal substrate layers of semiconductor material including a lower cladding layer, an active layer, and an upper cladding layer, (b) removing upper cladding layer portions flanking a mesa region to form surfaces flanking the mesa region that are closer to the active layer than the top surface of the mesa region, and (c) disordering regions of the structure underneath the removed portions to form disordered regions flanking an undisordered stripe region to a level below the active layer and having a lower refractive index than that of the stripe region, said disordered regions extending into said mesa region.

2. The method of claim 1, wherein the disordering step (c) is carried out by providing a diffusion source of impurities or a vacancy-producing source at the flanking surfaces formed during step (b).

3. The method of claim 2, further comprising providing an etch-stop layer in the structure within 500 nm of the active layer and using the etch-stop layer to stop the removing step (b).

4. The method of claim 3, wherein an etchant is used to carry out the removing step (b), said etchant attacking the upper cladding layer much faster than the etch-stop layer.

5. The method of claim 1, wherein the upper cladding layer comprises AlInP, GaInP, or AlGaInP.

6. The method of claim 2, wherein the disordered regions surfaces formed during step (c) are semiconductive material having a band gap that is higher than that of the active layer.

7. The method of claim 1, wherein the lower cladding layer is n-type, and the upper cladding layer p-type, and at least the portions of the regions formed by disordering located furthest from the active layer comprise p-type material, high-resistance, or insulating material.

8. The method of claim 7, wherein the regions formed by disordering are of n-type material, and the said portions located furthest from the active layer are converted into p-type or insulating material.

9. The method of claim 8, wherein the conversion to p-type is carried out by a shallow in-diffusion of an acceptor impurity following which p-contact metallization is provided over the p-type converted material.

10. The method of claim 8, wherein the conversion to insulating material is carried out by oxidation or a proton implant.

11. The method of claim 1, wherein a dielectric layer is deposited over the disordered regions.

12. An index-guided semiconductor laser structure comprising:
(a) a III–V crystalline semiconductive substrate,
(b) epitaxially-grown semiconductive layers over the substrate including at least a lower cladding layer, an active layer, and an upper cladding layer,
(c) said upper cladding layer having a first surface remote from the active layer that is located no more than about 500 nm above the active layer,
(d) a semiconductive stripe region having at least a part of the upper cladding layer above the active layer,
(e) flanking regions of the structure extending on both sides of the stripe region and at least from the first surface down into the lower cladding layer and containing at least impurity or vacancy disordered material having a lower refractive index than that of the active layer, said flanking regions further extending into said stripe region.

13. The laser structure of claim 12, wherein the cladding and active layer comprise AlInP, GaInP, or AlGaInP.

14. The laser structure of claim 13, wherein the upper cladding layer is between about 100–500 nm thick.

15. The laser structure of claim 13, further comprising a GaInP or GaAs cap layer over the upper cladding layer, the upper part of said cap layer having a type of conductivity opposite to that of the flanking regions.

16. The laser structure of claim 12, wherein the flanking regions have a band gap higher than that of the active layer and are of the same type of conductivity as that of the lower cladding layer.

17. The laser structure of claim 12, further comprising insulator or high resistance portions overlying the flanking regions.

18. An index-guided semiconductor laser structure comprising:
(a) a III–V crystalline semiconductive substrate,
(b) epitaxially-grown semiconductive layers over the substrate having at least a lower cladding layer, an active layer, and an upper cladding layer,
(c) an etch-stop layer above the active layer but below at least part of the upper cladding layer,
(d) a semiconductive mesa region having at least the part of the upper cladding layer above the etch-stop layer,
(e) flanking regions of the structure extending on both sides of the mesa region and from the etch-stop layer down into the lower cladding layer and containing, at least impurity or vacancy disordered material having a lower refractive index than that of the active layer, the regions above the flanking regions being free of semiconductive material, the flanking regions further extending into said mesa region.

19. The laser structure of claim 18, wherein the cladding and active layers comprise AlInP, GaInP, or AlGaInP.

20. The laser structure of claim 18, wherein the etch-stop layer is between about 100 and 500 nm from the active layer.

21. A monolithic array of index-guided semiconductor laser structures comprising:
(a) a common III–V crystalline semiconductive substrate,
(b) epitaxially-grown semiconductive layers over the substrate having at least a lower cladding layer, an active layer, and an upper cladding layer,
(c) plural, laterally-spaced semiconductive stripe regions each having at least a part of the upper cladding layer,
(d) flanking regions of the structure extending on both sides of each of the stripe regions from an upper surface of the upper cladding down into the lower cladding layer and containing at least impurity or vacancy disordered material having a lower refractive index than that of the active layer, the flanking regions further extending into each of said stripe regions,
(e) the upper surface of the upper cladding layer being at most 500 nm above the active layer,
(f) means for individually passing current through each of the stripe regions.

22. The array of claim 21, wherein claim element (f) comprises a shared contact to the substrate, and individual contacts over the top of each of the stripe regions.

23. The array of claim 21, wherein the cladding and active layers comprise AlInP, GaInP, or AlGaInP.

24. The array of claim 21, wherein the flanking regions have a band gap higher than that of the stripe regions and are of the same type of conductivity as that of the lower cladding layer.

25. The array of claim 21, further comprising insulator portions overlying the flanking regions.

26. A monolithic array of index-guided semiconductor laser structures comprising:
(a) a common III–V crystalline semiconductive substrate;
(b) epitaxially-grown semiconductive layers over the substrate including at least a lower cladding layer, an active layer, and an upper cladding layer;
(c) an etch-stop layer above the active layer but below at least part of the upper cladding layer;
(d) plural, laterally-spaced semiconductive mesa regions each including at least the part of the upper cladding layer above the etch-stop layer,
(e) flanking regions of the structure extending on both sides of each of the mesa regions and from the etch-stop layer down into the lower cladding layer and containing at least impurity or vacancy disordered material having a lower refractive index than that of the active layer, the regions above the flanking regions being free of semiconductive material, the flanking regions further extending into each of said mesa regions;
(f) means for individually passing current through each of the mesa regions.

27. The array of claim 26 wherein the etch-stop layer is between about 100 and 500 nm from the active layer.

28. The array of claim 26, wherein claim element (f) comprises a shared contact to the substrate, and individual contacts over the top of each of the mesa regions.

29. The array of claim 26, wherein the cladding and active layers comprise AlInP, GaInP, or AlGaInP.

30. The array of claim 26, wherein the flanking regions have a band gap higher than that of the mesa regions and are of the same type of conductivity as that of the lower cladding layer.

31. The array of claim 26, further comprising insulator portions overlying the flanking regions.

32. The laser structure of claim 18, wherein the flanking regions also extend into the mesa region.

33. The array of claim 26, wherein the flanking regions also extend into the mesa region.

34. An index-guided semiconductor laser structure comprising:
   (a) a III–V crystalline semiconductive substrate;
   (b) epitaxially-grown semiconductive layers over the substrate, said layers including at least a lower cladding layer, an active layer, and an upper cladding layer, said cladding layers and active layer comprising AlInP, GaInP, or AlGaInP, said upper cladding layer being between about 100–500 nm thick;
   (c) said upper cladding layer having a first surface remote from the active layer that is located no more than about 500 nm above the active layer;
   (d) a semiconductive stripe region having at least a part of the upper cladding layer above the active layer;
   (e) flanking regions extending on both sides of the stripe region and from the first surface down into the lower cladding layer and containing at least impurity or vacancy disordered material having a lower refractive index than that of the active layer;
   (f) a substantially pure gold metal contact provided over the upper cladding layer.

35. The laser structure of claim 34, further comprising a thin contacting layer provided under the gold metal contact, said contacting layer having a thickness of the order of 500 A or les.

36. An index-guided semiconductor laser structure comprising:
   (a) a III–V crystalline semiconductive substrate,
   (b) epitaxially-grown semiconductive layers over the substrate; said layers including at least a lower cladding layer, an active layer, and an upper cladding layer;
   (c) an etch-stop layer above the active layer but below at least part of the upper cladding layer,
   (d) a semiconductive mesa region having at least the part of the upper cladding layer above the etch-stop layer;
   (e) flanking regions extending on both sides of the mesa region and from the etch-stop layer down into the lower cladding layer and containing at least impurity or vacancy disordered material having a lower refractive index than that of the active layer; the regions above the flanking regions being free of semiconductive material; the flanking regions further extending into said mesa region.

37. The laser structure of claim 34, wherein said lower and upper cladding layers and active layer include at least AlInP, GaInP, AlGaInP, GaAs or AlGaAs.

38. The laser structure of claim 35, wherein said lower and upper cladding layers and active layer include at least AlInP, GaInP, AlGaInP, GaAs or AlGaAs.

39. The laser structure of claim 36, wherein said lower and upper cladding layers and active layer include at least AlInP, GaInP, AlGaInP, GaAs or AlGaAs.

* * * * *